(12) United States Patent
Dieguez-Campo et al.

(10) Patent No.: US 10,483,465 B2
(45) Date of Patent: Nov. 19, 2019

(54) METHODS OF OPERATING A DEPOSITION APPARATUS, AND DEPOSITION APPARATUS

(71) Applicant: Applied Materials, Inc., Santa Clara, CA (US)

(72) Inventors: Jose Manuel Dieguez-Campo, Hanau (DE); Stefan Bangert, Steinau (DE); Andreas Lopp, Freigericht-Somborn (DE); Harald Wurster, Mömbris (DE); Dieter Haas, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/300,484

(22) PCT Filed: May 10, 2016

(86) PCT No.: PCT/EP2016/060440
§ 371 (c)(1),
(2) Date: Nov. 9, 2018

(87) PCT Pub. No.: WO2017/194098
PCT Pub. Date: Nov. 16, 2017

(65) Prior Publication Data
US 2019/0148642 A1    May 16, 2019

(51) Int. Cl.
*H01L 51/00* (2006.01)
*H01L 51/56* (2006.01)
(Continued)

(52) U.S. Cl.
CPC ........ *H01L 51/0011* (2013.01); *C23C 14/042* (2013.01); *C23C 14/12* (2013.01);
(Continued)

(58) Field of Classification Search
CPC combination set(s) only.
See application file for complete search history.

(56) References Cited

U.S. PATENT DOCUMENTS

| 6,365,016 B1 * | 4/2002 | Iacovangelo ......... C23C 14/228 |
| | | 204/192.38 |
| 2011/0053296 A1 | 3/2011 | Lee et al. |

(Continued)

FOREIGN PATENT DOCUMENTS

| JP | 3802846 B2 | 7/2006 |
| JP | 2009197336 A | 9/2009 |

(Continued)

OTHER PUBLICATIONS

Korean Office Action dated May 1, 2018 for Application No. 10-2018-7007939.
(Continued)

*Primary Examiner* — Mamadou L Diallo
(74) *Attorney, Agent, or Firm* — Patterson + Sheridan LLP

(57) ABSTRACT

A method of operating a deposition apparatus is provided. The method comprises: Deposition of an evaporated source material on a substrate by guiding the evaporated source material from one or more outlets of an evaporation source toward the substrate, wherein part of the evaporated source material is blocked by and attaches to a shielding device arranged between the one or more outlets and the substrate, followed by a cleaning of the shielding device by at least locally heating the shielding device for releasing at least part of the attached source material from the shielding device. According to a further aspect, a deposition apparatus is provided that can be operated according to the described methods.

20 Claims, 8 Drawing Sheets

(51) Int. Cl.
*C23C 14/12* (2006.01)
*C23C 14/04* (2006.01)
*C23C 14/24* (2006.01)
*C23C 14/56* (2006.01)

(52) U.S. Cl.
CPC ............ *C23C 14/24* (2013.01); *C23C 14/243* (2013.01); *C23C 14/564* (2013.01); *H01L 51/001* (2013.01); *H01L 51/56* (2013.01)

(56) References Cited

U.S. PATENT DOCUMENTS

| | | | |
|---|---|---|---|
| 2012/0064728 A1 | 3/2012 | Yi et al. | |
| 2012/0258239 A1* | 10/2012 | Hoffmann | C23C 14/243 427/10 |
| 2015/0284841 A1* | 10/2015 | Keller | H01J 37/32091 427/535 |
| 2016/0289817 A1* | 10/2016 | Beck | H01L 31/046 |
| 2018/0245206 A1* | 8/2018 | Bangert | C23C 14/243 |

FOREIGN PATENT DOCUMENTS

| JP | 2012117114 A | 6/2012 |
|---|---|---|
| JP | 2012-216373 A | 11/2012 |
| JP | 5400749 B2 | 1/2014 |
| KR | 2004-0043360 A | 5/2004 |
| KR | 2014-0086344 A | 7/2014 |
| TW | 201528411 A | 7/2015 |
| TW | 201542300 A | 11/2015 |

OTHER PUBLICATIONS

International Preliminary Report on Patentability dated May 7, 2018 for Application No. PCT/EP2016/060440.

International Search Report and Written Opinion dated Feb. 14, 2017 for Application No. PCT/EP2016/060440.

Taiwan Patent Application No. 107105141, Examination Notice and Search Report, dated Jan. 17, 2018, 4 pages.

Taiwan Patent Application No. 107105134, Examination Notice and Search Report, dated Jan. 18, 2018, 6 pages.

Taiwan Patent Application No. 107105133, Examination Notice and Search Report, dated Jan. 18, 2018, 7 pages.

Japanese Patent Application No. 2018-512121, Office Action dated Apr. 12, 2018, English Translations, 3 pages.

\* cited by examiner

METHODS OF OPERATING A DEPOSITION APPARATUS, AND DEPOSITION APPARATUS

CROSS-REFERENCE TO RELATED APPLICATIONS

This application is a National Stage application of PCT/EP2016/060440, filed May 10, 2016, which is incorporated by reference in its entirety.

TECHNICAL FIELD

Embodiments of the present disclosure relate to methods of depositing material, e.g. organic material, on a substrate and to a deposition apparatus for depositing material, e.g. organic material, on a substrate. Embodiments of the present disclosure particularly relate to deposition apparatuses with an evaporation source configured to deposit an evaporated source material on a substrate as well as to methods of operating a deposition apparatus for depositing an evaporated source material on a substrate, particularly for manufacturing devices including organic materials therein.

BACKGROUND

Organic evaporators are a tool for the production of organic light-emitting diodes (OLED). OLEDs are a special type of light-emitting diode in which the emissive layer comprises a thin-film of certain organic compounds. Organic light emitting diodes (OLEDs) are used in the manufacture of television screens, computer monitors, mobile phones and other hand-held devices for displaying information. OLEDs can also be used for general space illumination. The range of colors, brightness, and viewing angle possible with OLED displays are greater than that of traditional LCD displays because OLED pixels directly emit light and do not need a back light. Therefore, the energy consumption of OLED displays is considerably less than that of traditional LCD displays. Further, the fact that OLEDs can be manufactured onto flexible substrates results in further applications. A typical OLED display, for example, may include layers of organic material situated between two electrodes that are all deposited on a substrate in a manner to form a matrix display panel having individually energizable pixels. The OLED is generally placed between two glass panels, and the edges of the glass panels are sealed to encapsulate the OLED therein.

There are many challenges encountered in the manufacture of such display devices. OLED displays or OLED lighting applications include a stack of several organic materials, which are for example evaporated in a vacuum. The organic materials are deposited in a subsequent manner through shadow masks. For the fabrication of OLED stacks with high efficiency, the co-deposition or co-evaporation of two or more materials, e.g. host and dopant, leading to mixed/doped layers is beneficial. Further, it has to be considered that there are several process conditions for the evaporation of the very sensitive organic materials.

For depositing the material on a substrate, the material is heated until the material evaporates. Pipes guide the evaporated material to the substrates through nozzles. In the past years, the precision of the deposition process has been increased, e.g. for being able to provide smaller and smaller pixel sizes. In some processes, masks are used for defining the pixels when the evaporated material passes through the mask openings. However, shadowing effects of a mask, the spread of the evaporated material and the like make it difficult to further increase the precision and the predictability of the evaporation process.

In view of the above, an increased precision and predictability of evaporation processes for manufacturing devices having a high quality and precision is beneficial.

SUMMARY

In light of the above, methods of operating a deposition apparatus as well as deposition apparatuses are provided.

According to an aspect of the present disclosure, a method of operating a deposition apparatus is provided, comprising deposition of an evaporated source material on a substrate by guiding the evaporated source material from one or more outlets of an evaporation source toward the substrate, wherein part of the evaporated source material is blocked by and attaches to a shielding device arranged between the one or more outlets and the substrate; followed by cleaning the shielding device by at least locally heating the shielding device for releasing at least part of the attached source material from the shielding device.

According to a further aspect of the present disclosure, a method of operating a deposition apparatus is provided, comprising: deposition of an evaporated source material on a substrate, comprising: Moving an evaporation source along a surface of the substrate while guiding the evaporated source material from one or more outlets of the evaporation source toward the substrate, wherein part of the evaporated source material is blocked by and attaches to a shielding device arranged between the one or more outlets and the substrate; rotating the evaporation source by a first rotation angle from a deposition position to a service position; cleaning the shielding device by at least locally heating the shielding device in the service position; rotating the evaporation source by a second rotation angle back to the deposition position or to a further deposition position; and deposition of the evaporated source material on the substrate or on a further substrate, comprising: Moving the evaporation source along a surface of the further substrate, while guiding the evaporated source material from the one or more outlets toward the substrate or toward the further substrate.

According to a further aspect of the present disclosure, a deposition apparatus is provided. The deposition apparatus comprises an evaporation source configured to deposit an evaporated source material on a substrate, wherein the evaporation source comprises a distribution pipe with one or more outlets for guiding the evaporated source material toward the substrate; and a shielding device arranged downstream from the one or more outlets and configured to partially block the evaporated source material propagating toward the substrate; an actuator device configured to bring the deposition apparatus from a deposition position to a service position, wherein a heating device is provided for at least locally heating the shielding device, when the deposition apparatus is in the service position.

Further aspects, advantages and features of the present disclosure are apparent from the description and the accompanying drawings.

BRIEF DESCRIPTION OF THE DRAWINGS

So that the manner in which the above recited features of the present disclosure can be understood in detail, a more particular description of the present disclosure, briefly summarized above, may be had by reference to embodiments. The accompanying drawings relate to embodiments of the present disclosure and are described in the following.

DETAILED DESCRIPTION OF EMBODIMENTS

Figure 1:
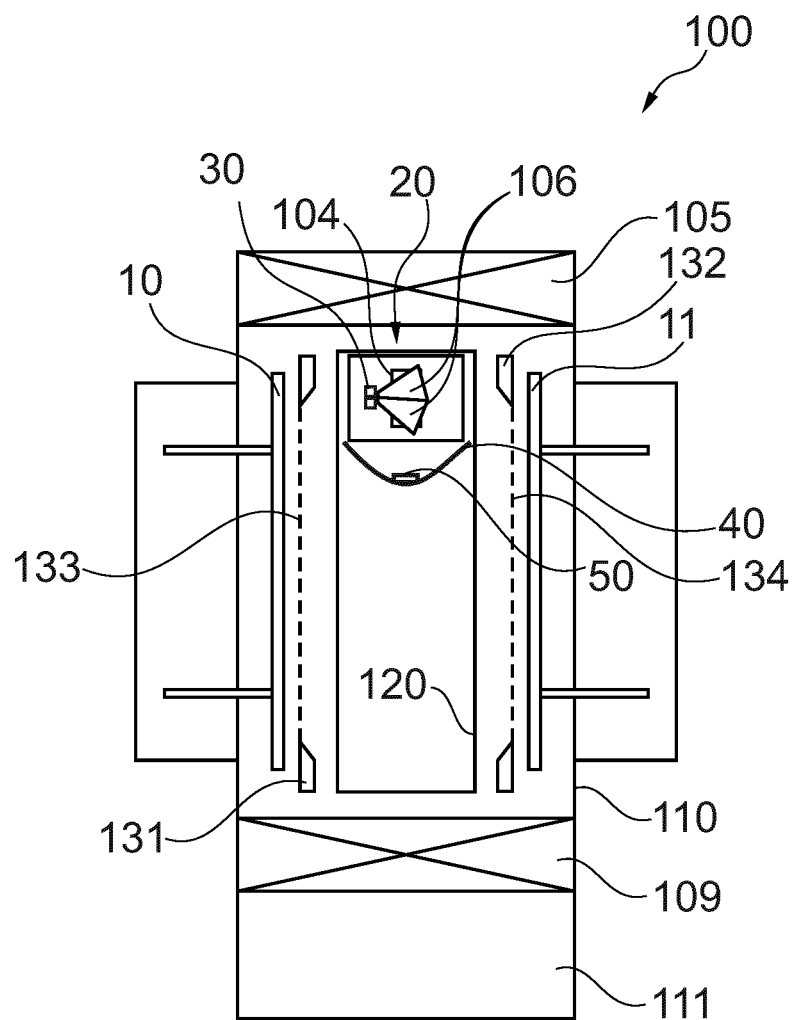
FIG. 1 shows a schematic top view of a deposition apparatus for depositing an evaporated source material in a vacuum chamber which may be operated in accordance with methods described herein.

Reference will now be made in detail to the various embodiments of the present disclosure, one or more examples of which are illustrated in the figures. Within the following description of the drawings, the same reference numbers refer to the same components. Generally, only the differences with respect to individual embodiments are described. Each example is provided by way of explanation and is not meant as a limitation of present disclosure. Features illustrated or described as part of one embodiment can be used on or in conjunction with other embodiments to yield yet a further embodiment. It is intended that the description includes such modifications and variations.

As used herein, the term "source material" may be apprehended as a material that is evaporated and deposited on a surface of a substrate. For example, in embodiments described herein, an evaporated organic material that is deposited on a surface of a substrate may be a source material. Non-limiting examples of organic materials include one or more of the following: ITO, NPD, Alq$_3$, Quinacridone, Mg/AG, starburst materials, and the like.

As used herein, the term "evaporation source" may be understood as an arrangement providing an evaporated source material to be deposited on a substrate. In particular, the evaporation source may be configured to direct an evaporated source material to be deposited on a substrate toward a deposition area in a vacuum chamber, such as a vacuum deposition chamber of a deposition apparatus. The evaporated source material may be directed toward the substrate via a plurality of nozzles or outlets of the evaporation source. The nozzles or outlets may be directed toward the deposition area, particularly toward the substrate to be coated, when the deposition apparatus is provided in a deposition position.

The evaporation source may include an evaporator or a crucible which evaporates the source material to be deposited on the substrate, and a distribution pipe, which is in fluid connection with the crucible and which is configured to transport the evaporated source material to the plurality of outlets or nozzles for emitting the evaporated source material into the deposition area.

As used herein, the term "crucible" may be understood as a device or a reservoir providing or containing the source material to be deposited. Typically, the crucible may be heated for evaporating the source material to be deposited on the substrate. According to embodiments herein, the crucible may be in fluid communication with the distribution pipe to which the evaporated source material may be delivered.

As used herein, the term "distribution pipe" may be understood as a pipe for guiding and distributing the evaporated source material. In particular, the distribution pipe may guide the evaporated source material from a crucible to a plurality of outlets or nozzles in the distribution pipe. As used herein, the term "a plurality of outlets" typically includes at least two or more outlets. According to embodiments described herein, the distribution pipe may be a linear distribution pipe extending in a first, especially longitudinal, direction, particularly in a vertical direction. In some embodiments, the distribution pipe may include a pipe having the shape of a cylinder. The cylinder may have a circular bottom shape or any other suitable bottom shape. Examples of distribution pipes will be described in more detail below. In some embodiments, the evaporation source may include two or three crucibles and two or three associated distribution pipes.

FIG. 1 shows a schematic top view of a deposition apparatus 100 according to embodiments described herein that can be operated in accordance with the methods described herein. The deposition apparatus 100 comprises an evaporation source 20 positioned in a vacuum chamber 110. According to some embodiments, which can be combined with other embodiments described herein, the evaporation source 20 is configured for a translational movement along a surface of the substrate to be coated. Further, the evaporation source 20 may be configured for rotation around an axis.

According to some embodiments, the evaporation source 20 may have one or more evaporation crucibles and one or more distribution pipes. For instance, the evaporation source 20 shown in FIG. 1 includes two evaporation crucibles 104 and two distribution pipes 106. As is shown in FIG. 1, a substrate 10 and a further substrate 11 are provided in the vacuum chamber 110 for receiving evaporated source material.

According to some embodiments herein, a mask assembly for masking a substrate can be provided between the substrate and the evaporation source. The mask assembly may include a mask and a mask frame to hold the mask in a predetermined position. In embodiments herein, one or more additional tracks may be provided for supporting and displacing the mask assembly. For instance, the embodiment shown in FIG. 1 has a first mask 133 supported by a first mask frame 131 arranged between the evaporation source 20 and the substrate 10 and a second mask 134 supported by a second mask frame 132 arranged between the evaporation source 20 and the further substrate 11. The substrate 10 and the further substrate 11 may be supported on respective transportation tracks (not shown in FIG. 1) within the vacuum chamber 110.

FIG. 1 further shows a shielding device 30, which is provided to guide the evaporated source material from the one or more distribution pipes 106 to the substrate 10 and/or to the further substrate 11, respectively, as will be explained later in more detail. The shielding device 30 may be provided downstream from the outlets 22 of the distribution pipe 106, e.g. between the distribution pipe and the substrate. In some embodiments, the shielding device 30 may be detachably fixed to at least one distribution pipe. For example, the distribution pipe 106 may comprise a plurality of nozzles with respective outlets for guiding the evaporated source material from the interior of the distribution pipe toward the substrate. The shielding device 30 can be attached to a single distribution pipe such as to follow a local thermally caused movement, e.g. a thermal expansion or contraction, of the single distribution pipe. The shape and the opening angle of the plume of evaporated source material impacting on the mask and on the substrate can be maintained essentially constant, because the shielding device can follow a thermal movement of the nozzles.

The outlets may be configured as nozzle outlets of nozzles which may protrude into the shielding device, e.g. into the apertures of the shielding device. In some embodiments, the nozzles are not in direct contact with the shielding device, in order to reduce a heat flow from the typically hot nozzles toward the optionally cooled shielding device. Heat radiation toward the substrate can be reduced.

In embodiments herein, if masks are used for depositing material on a substrate, such as in an OLED production system, the mask may be a pixel mask with pixel openings having the size of about 50 μm×50 μm, or even below, such as a pixel opening with a dimension of the cross section (e.g. the minimum dimension of a cross section) of about 30 μm or less, or about 20 μm. In one example, the pixel mask may have a thickness of about 40 μm. Considering the thickness of the mask and the size of the pixel openings, a shadowing effect may appear, where the walls of the pixel openings in the mask shadow the pixel opening. The shielding device 30 described herein may limit the maximum angle of impact of the evaporated source material on the masks and on the substrates and reduce the shadowing effect.

According to embodiments described herein, the material of the shielding device 30 may be adapted for evaporated source material having a temperature of about 100° C. to about 600° C. In some embodiments, the shielding device may include a material having a thermal conductivity larger than 21 W/(m·K) and/or a material being chemically inert to, for instance, evaporated organic material. According to some embodiments, the shielding device may include at least one of Cu, Ta, Ti, Nb, DLC, and graphite or may include a coating with at least one of the named materials.

According to embodiments described herein, the substrate may be coated with a source material in an essentially vertical position. Typically, the distribution pipe is configured as a line source extending essentially vertically. In embodiments described herein, which can be combined with other embodiments described herein, the term "essentially vertically" is understood, particularly when referring to the substrate orientation, to allow for a deviation from the vertical direction of 20° or below, e.g. of 10° or below. For example, this deviation can be provided because a substrate support with some deviation from the vertical orientation might result in a more stable substrate position. Yet, an essentially vertical substrate orientation during deposition of the source material is considered different from a horizontal substrate orientation. The surface of the substrate is coated by a line source extending in one direction corresponding to one substrate dimension and a translational movement along the other direction corresponding to the other substrate dimension.

In some embodiments, the evaporation source 20 may be provided in the vacuum chamber 110 of the deposition apparatus 100 on a track, e.g. a looped track (not shown in the figures) or linear guide 120. The track or linear guide 120 is configured for the translational movement of the evaporation source 20. According to different embodiments, which can be combined with other embodiments described herein, a drive for the translational movement can be provided in the evaporation source 20, at the track or linear guide 120, within the vacuum chamber 110 or a combination thereof. Accordingly, the evaporation source can be moved along the surface of the substrate to be coated during deposition, particularly along a linear path. Uniformity of the deposited material on the substrate can be improved.

FIG. 1 further shows a valve 105, for example, a gate valve. The valve 105 allows for a vacuum seal to an adjacent vacuum chamber (not shown in FIG. 1). According to embodiments herein, the valve 105 can be opened for the transport of a substrate or a mask into and/or out of the vacuum chamber 110.

According to some embodiments, which can be combined with other embodiments described herein, a further vacuum chamber, such as maintenance vacuum chamber 111 is provided adjacent to the vacuum chamber 110. The vacuum chamber 110 and the maintenance vacuum chamber 111 are connected by a valve 109. The valve 109 is configured for opening and closing a vacuum seal between the vacuum chamber 110 and the maintenance vacuum chamber 111. According to embodiments herein, the evaporation source 20 can be transferred to the maintenance vacuum chamber 111 while the valve 109 is in an open state. Thereafter, the valve can be closed to provide a vacuum seal between the vacuum chamber 110 and the maintenance vacuum chamber 111. If the valve 109 is closed, the maintenance vacuum chamber 111 can be vented and opened for maintenance of the evaporation source 20 without breaking the vacuum in the vacuum chamber 110.

The described material deposition arrangement may be used for various applications, including applications for OLED device manufacturing including processing methods, wherein two or more source materials such as, for instance, two or more organic materials are evaporated simultaneously. In the example shown in FIG. 1, two or more distribution pipes 106 and corresponding evaporation crucibles are provided next to each other. For example, in some embodiments, three distribution pipes may be provided next to each other, each distribution pipe including one outlet or a plurality of outlets 22 for introducing the evaporated source material from the interior of the respective distribution pipe into a deposition area of the vacuum chamber. The outlets may be provided along the linear extension direction of the respective distribution pipe, e.g. at an equal spacing. Each distribution pipe may be configured for introducing a different source material into the deposition area of the vacuum chamber.

Although the embodiment shown in FIG. 1 provides a deposition apparatus 100 with an evaporation source 20 that is movable, the skilled person may understand that the above described embodiments may also be applied to deposition systems in which the substrate is moved during processing. For instance, the substrates to be coated may be guided and driven along stationary material deposition arrangements.

Embodiments described herein particularly relate to deposition of organic materials, e.g. for OLED display manufacturing on large area substrates. According to some embodiments, large area substrates or carriers supporting one or more substrates may have a size of at least $0.174 \text{ m}^2$. For instance, the deposition system may be adapted for processing large area substrates, such as substrates of GEN 5, which corresponds to about $1.4 \text{ m}^2$ substrates (1.1 m×1.3 m), GEN 7.5, which corresponds to about 4.29 m² substrates (1.95 m×2.2 m), GEN 8.5, which corresponds to about 5.7 m² substrates (2.2 m×2.5 m), or even GEN 10, which corresponds to about 8.7 m² substrates (2.85 m×3.05 m). Even larger generations such as GEN 11 and GEN 12 and corresponding substrate areas can similarly be implemented.

According to embodiments herein, which can be combined with other embodiments described herein, the substrate thickness can be from 0.1 to 1.8 mm and the holding arrangement for the substrate, can be adapted for such substrate thicknesses. The substrate thickness can be about 0.9 mm or below, such as 0.5 mm or 0.3 mm, and the holding arrangements are adapted for such substrate thicknesses. Typically, the substrate may be made from any material suitable for material deposition. For instance, the substrate may be made from a material selected from the group including glass (for instance soda-lime glass, borosilicate glass etc.), metal, polymer, ceramic, compound materials, carbon fiber materials or any other material or combination of materials which can be coated by a deposition process.

According to some embodiments described herein, the deposition apparatus 100 may further include a material collection unit 40 configured as a shielding wall. The material collection unit 40 may be arranged to collect evaporated source material emanating from the evaporation source and/or emanating from the shielding device 30, when the evaporation source is in a rotated position, particularly during rotation of the evaporation source 20 around a rotation axis.

In some embodiments, a heating device 50 may be provided for cleaning the shielding device in a service position of the deposition apparatus 100, as will be explained in more detail below.

Figure 2A:
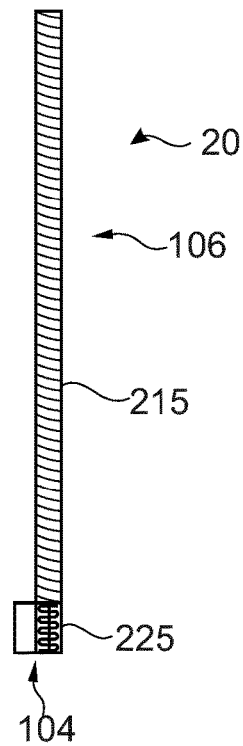
FIG. 2A, FIG. 2B, and FIG. 2C show schematic views of portions of an evaporation source of a deposition apparatus according to embodiments described herein.
Figure 2B:
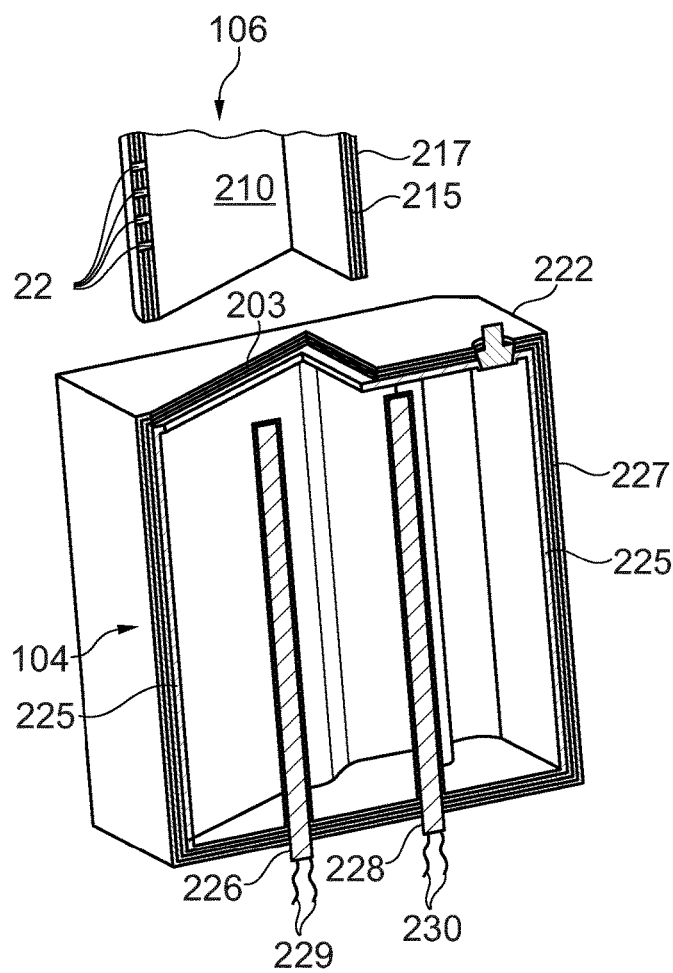
Figure 2C:
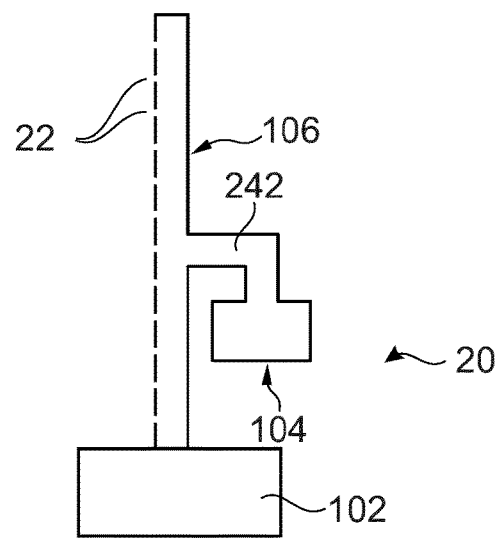

FIG. 2A to FIG. 2C show portions of an evaporation source 20 according to embodiments described herein. As is shown in FIG. 2A, the evaporation source 20 can include a distribution pipe 106 and an evaporation crucible 104. For example, the distribution pipe can be an elongated cube with heating unit 215. The evaporation crucible can be a reservoir for a source material, such as an organic material to be evaporated with a heating unit 225.

According to embodiments, which can be combined with other embodiments described herein, a plurality of outlets, such as nozzles, may be arranged along a length direction of the evaporation source 20. In particular, the plurality of outlets may be arranged along a length direction of the distribution pipe. According to an alternative embodiment, one elongated outlet extending along the length direction of the evaporation source and/or the length of the distribution pipe can be provided. For example, the elongated opening can be a slit.

According to some embodiments, which can be combined with other embodiments described herein, the distribution pipe extends essentially vertically in a length direction. For example, the length of the distribution pipe 106 corresponds at least to the height of the substrate to be deposited in the deposition apparatus. In many cases, the length of the distribution pipe 106 will be longer than the height of the substrate to be deposited, at least by 10% or even 20%, which allows for a uniform deposition at the upper end of the substrate and/or the lower end of the substrate.

According to some embodiments, which can be combined with other embodiments described herein, the length of the distribution pipe can be 1.3 m or above, for example 2.5 m or above. According to one configuration, as shown in FIG. 2A, the evaporation crucible 104 is provided at the lower end of the distribution pipe 106. Typically, the source material is evaporated in the evaporation crucible 104. The evaporated source material enters at the bottom of the distribution pipe 106 and is guided essentially sideways through the plurality of outlets in the distribution pipe, e.g. toward an essentially vertically oriented substrate.

According to some embodiments, which can be combined with other embodiments described herein, the plurality of outlets are arranged to have a main emission direction X to be horizontal +/−20°. According to some specific embodiments, the main emission direction X can be oriented slightly upward, e.g. to be in a range from horizontal to 15° upward, such as 3° to 7° upward. Similarly, the substrate can be slightly inclined to be substantially perpendicular to the evaporation direction, which may reduce the generation of particles. For illustrative purposes, the evaporation crucible 104 and the distribution pipe 106 are shown without heat shields in FIG. 2A. The heating unit 215 and the heating unit 225 can be seen in the schematic perspective view shown in FIG. 2B.

FIG. 2B shows an enlarged schematic view of a portion of the evaporation source, in particular, of the distribution pipe 106 connected to the evaporation crucible 104. A flange unit 203 is provided, which is configured to provide a connection between the evaporation crucible 104 and the distribution pipe 106. For example, the evaporation crucible and the distribution pipe are provided as separate units, which can be separated and connected or assembled at the flange unit, e.g. for operation of the evaporation source.

The distribution pipe 106 has an inner hollow space 210. A heating unit 215 is provided to heat the distribution pipe. The distribution pipe 106 can be heated to a temperature such that the evaporated source material provided by the evaporation crucible 104 does not condense at an inner portion of the wall of the distribution pipe 106. Two or more heat shields 217 are provided around the tube of the distribution pipe 106. The heat shields are configured to reflect heat energy provided by the heating unit 215 back toward the inner hollow space 210. The energy to heat the distribution pipe 106, i.e. the energy provided to the heating unit 215, can be reduced because the heat shields 217 reduce heat losses. Heat transfer to other distribution pipes and/or to the mask or substrate can be reduced. According to some embodiments, which can be combined with other embodiments described herein, the heat shields 217 can include two or more heat shield layers, e.g. five or more heat shield layers, such as ten heat shield layers.

Typically, as shown in FIG. 2B, the heat shields 217 include openings at positions of the outlets 22 in the distribution pipe 106. The enlarged view of the evaporation source shown in FIG. 2B shows four outlets. The outlets 22 can be provided along a length direction of the distribution pipe 106. As described herein, the distribution pipe 106 can be provided as a linear distribution pipe, for example, having a plurality of openings disposed therein. For instance, the distribution pipe may have more than 30 outlets, such as 40, 50 or 54 outlets arranged along a length direction of the distribution pipe. According to embodiments herein, the outlets may be spaced apart from each other. For instance, the outlets may be space apart by a distance of 1 cm or more, for example, by a distance from 1 cm to 3 cm, like for example, by a distance of 2 cm.

During operation, the distribution pipe 106 is connected to the evaporation crucible 104 at the flange unit 203. The evaporation crucible 104 is configured to receive the source material to be evaporated and to evaporate the source material. FIG. 2B shows a cross-section through the housing of the evaporation crucible 104. A refill opening is provided, for example, at an upper portion of the evaporation crucible, which can be closed using a plug 222, a lid, a cover or the like for closing the enclosure of evaporation crucible 104.

An outer heating unit 225 is provided within the enclosure of the evaporation crucible 104. The outer heating unit 225 can extend at least along a portion of the wall of the evaporation crucible 104. According to some embodiments, which can be combined with other embodiments described herein, additionally or alternatively one or more central heating elements can be provided. FIG. 2B shows two central heating elements 226, 228. The first central heating element 226 and the second central heating element 228 can respectively include a first conductor 229 and a second conductor 230 for providing electrical power to the central heating elements 226, 228.

To improve the heating efficiency of the source material within the evaporation crucible, the evaporation crucible 104 can further include a heat shield 227 configured to reflect heat energy provided by the outer heating unit 225 and, if present, by the central heating elements 226, 228, back into the enclosure of the evaporation crucible 104.

According to some embodiments, which have been described herein, heat shields such as heat shield 217 and heat shield 227 can be provided for the evaporation source. The heat shields can reduce energy loss from the evaporation source, which also reduces the overall energy consumed by the evaporation source to evaporate a source material. As a further aspect, particularly for deposition of organic materials, heat radiation originating from the evaporation source, especially heat radiation toward the mask and the substrate during deposition can be reduced. Particularly for the deposition of organic materials on masked substrates, and even more for display manufacturing, the temperature of the substrate and the mask needs to be precisely controlled. Heat radiation originating from the evaporation source can be reduced or avoided by heat shields such as, for instance, heat shield 217 and heat shield 227.

These shields can include several shielding layers to reduce the heat radiation to the outside of the evaporation source 20. As a further option, the heat shields may include shielding layers, which are actively cooled by a fluid, such as air, nitrogen, water or other appropriate cooling fluids. According to yet further embodiments described herein, the one or more heat shields can include sheet metals surrounding respective portions of the evaporation source, for instance, surrounding the distribution pipe 106 and/or the evaporation crucible 104. According to embodiments herein, the sheet metals can have thicknesses of 0.1 mm to 3 mm, can be selected from at least one material selected from the group including ferrous metals (SS) and non-ferrous metals (Cu, Ti, Al), and/or can be spaced with respect to each other, for example, by a gap of 0.1 mm or more.

According to some embodiments described herein and as exemplarily shown with respect to FIG. 2A and FIG. 2B, the evaporation crucible 104 is provided at a lower side of the distribution pipe 106. According to yet further embodiments, which can be combined with other embodiments described herein, a vapor conduit 242 may be provided at the central portion of the distribution pipe 106 or at another position between the lower end of the distribution pipe and the upper end of the distribution pipe.

FIG. 2C illustrates an example of the evaporation source 20 having a distribution pipe 106 and a vapor conduit 242 provided at a central portion of the distribution pipe. Evaporated source material generated in the evaporation crucible 104 is guided through the vapor conduit 242 to the central portion of the distribution pipes 106. The evaporated source material exits the distribution pipe 106 through a plurality of outlets 22. The distribution pipe 106 is supported by a support 102 as described with respect to other embodiments described herein. According to yet further embodiments described herein, two or more vapor conduits 242 may be provided at different positions along the length of the distribution pipe 106. The vapor conduits 242 can either be connected to one evaporation crucible or to several evaporation crucibles. For example, each vapor conduit 242 can have a corresponding evaporation crucible. Alternatively, the evaporation crucible 104 can be in fluid communication with two or more vapor conduits 242, which are connected to the distribution pipe 106.

As described herein, the distribution pipe can be a hollow cylinder. The term cylinder can be understood as commonly accepted as having a circular bottom shape and a circular upper shape and a curved surface area or shell connecting the upper circle and the little lower circle. According to further additional or alternative embodiments, which can be combined with other embodiments described herein, the term cylinder can further be understood in the mathematical sense as having an arbitrary bottom shape and an identical upper shape and a curved surface area or shell connecting the upper shape and the lower shape. The cylinder does not necessarily need to have a circular cross-section.

Figure 3:
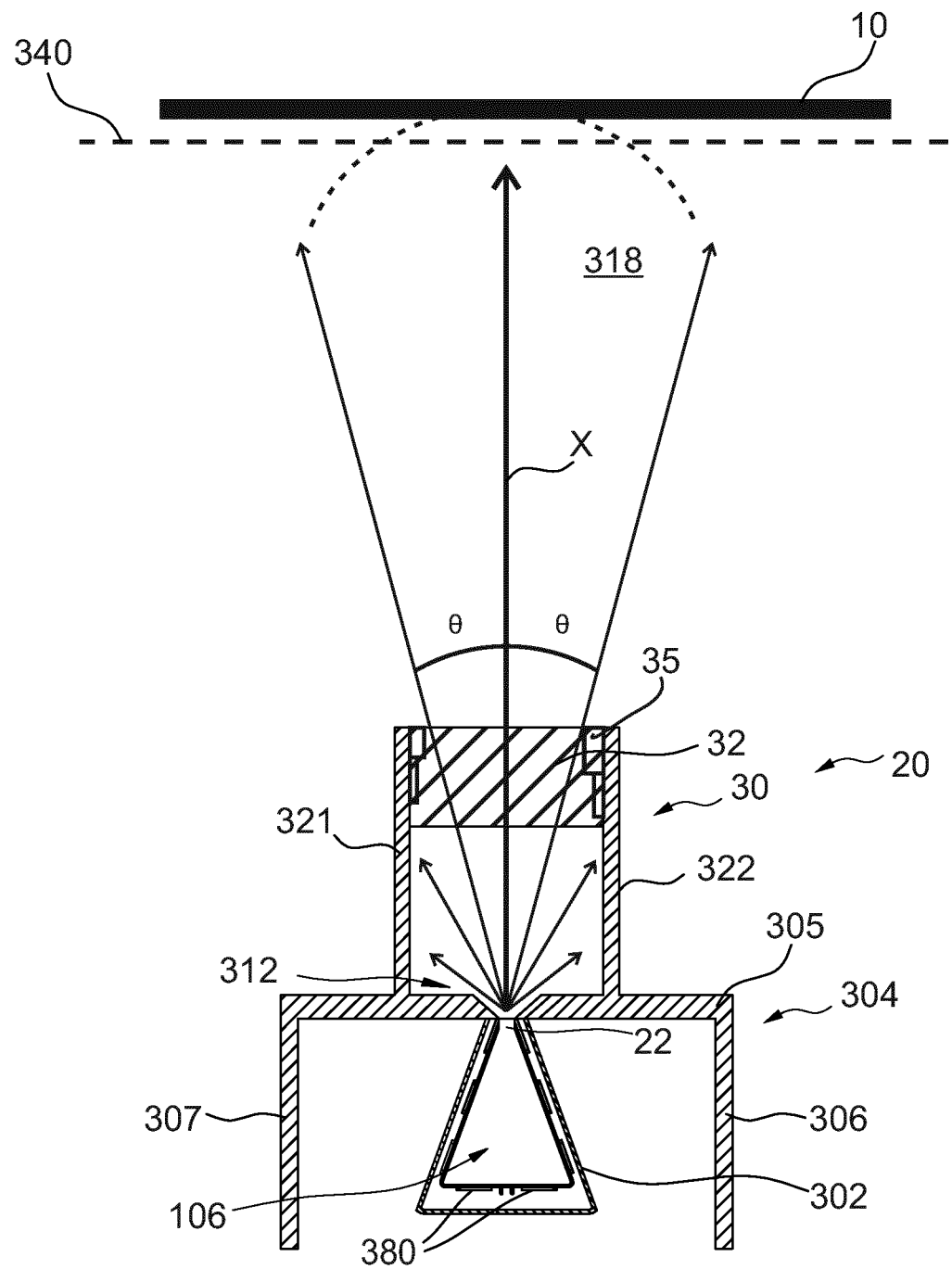
FIG. 3 shows a schematic top view of a deposition apparatus according to embodiments described herein.

FIG. 3 shows a schematic top view of an evaporation source 20 of a deposition apparatus 100 according to embodiments herein. The evaporation source 20 shown in FIG. 3 includes one distribution pipe 106. According to embodiments described herein, the distribution pipe 106 may extend in a length direction and a plurality of outlets 22 may be arranged along the length direction of the distribution pipe 106. The walls of the distribution pipe may be heated by heating elements 380, which are mounted or attached to the walls. For reducing the heat radiation toward the substrate 10, a first outer shield 302 which surrounds the distribution pipe 106 may be cooled. An additional second outer shield 304 may be provided to reduce the heat load directed toward the deposition area or a substrate 10, respectively. The second outer shield 304 may have a front wall 305, facing the substrate 10 and/or facing the mask 340. The second outer shield 304 may include one or more side walls. For instance, the outer shield 304 includes a first side wall 306 and a second side wall 307. According to embodiments herein, the front wall 305, first side wall 306 and second side wall 307 may be provided as a U-shaped outer shield 304 to reduce the heat radiation toward the deposition area, i.e. a substrate and/or a mask.

According to some embodiments, which can be combined with other embodiments described herein, the shields can be provided as metal plates having conduits for cooling fluid, such as water, attached to the metal shields or provided within the metal shields. Additionally, or alternatively, thermoelectric cooling devices or other cooling devices can be provided to cool the shields. Typically, the outer shields, i.e. the outermost shields surrounding the inner hollow space of a distribution pipe 106, can be cooled.

In some embodiments, the evaporation source 20 may comprise a shielding device 30 which may be arranged downstream from the outlets 22. The shielding device may be configured for guiding the evaporated source material toward the substrate and for shaping the plume of evaporated source material. Accordingly, the shielding device 30 may also be referred to herein as a "shaper shield". In the embodiment shown in FIG. 3, the shielding device 30 is configured as a part of the outer shield 304. In other embodiments, the shielding device may be provided as a separate unit which may be removably attached to the distribution pipe 106. In some embodiments, the shielding device may comprise a plurality of shielding units. The shielding device may include a plurality of apertures 32 wherein each aperture may be arranged in front of an associated outlet 22, wherein part of the source material emitted from the associated outlet is blocked by and may attach to the shielding wall which surrounds the apertures 32. The source material that has accumulated on the shielding device is denoted by reference numeral 35 is FIG. 3.

According to some embodiments, the shielding device 30 can be cooled to further reduce the heat load emitted toward the deposition area. Arrows 312 illustrate the evaporated source material exiting the distribution pipe 106 via the outlets 22. According to embodiments herein, the evaporation source 20 typically includes a plurality of outlets 22 distributed along a length direction of the evaporation source 20. For instance, the evaporation source 20 may include thirty or more outlets, which may be spaced apart from each other by a distance of, for example, 2 cm. According to some embodiments, the shielding device 30 delimits the distribution cone or plume 318 of evaporated source material distributed toward the substrate 10. The shielding device 30 may configured to block at least a portion of the evaporated source material, e.g. the outer angular portion of the plume 318.

According to embodiments disclosed herein, the shielding device 30 includes at least one side surface. The at least one side surface may be configured for blocking evaporated source material depending on the emission angle of the plume of evaporated source material from the plurality of outlets in a plane direction perpendicular to the length direction of the evaporation source. In FIG. 3, the shielding device 30 includes a first side wall 321 and a second side wall 322. Each of the first and second side walls provide a side surface configured for blocking evaporated source material having a high emission angle (θ) in a plane perpendicular to the length direction of the evaporation source.

According to embodiments described herein, the at least one side surface may be configured for blocking evaporated source material of the plume 318 of evaporated source material having an emission angle (θ) greater than 45°, or greater than 30°, from a main emission direction X of the evaporated source material.

In some embodiments, which may be combined with other embodiments described herein, the shielding device may be configured for blocking evaporated source material in a plane parallel to the length direction of the evaporation source 20.

In some embodiments, the shielding device may include a plurality of apertures 32 which are surrounded by a circumferential shielding wall, respectively. Each aperture may be arranged in front of two or more outlets 22 of the evaporation source such that the evaporated source material emitted from the two or more outlets 22 may be shaped by the shielding wall of an associated aperture. In some embodiments, each aperture 32 of the shielding device may be arranged in front of a single associated outlet of the evaporation source 20, respectively, such that the evaporated source material of only the associated outlet streams through an aperture. Each plume of evaporated source material emitted from an outlet may be shaped individually by an associated aperture of the shielding device 30.

The apertures of the shielding device may be configured to shape the plumes of evaporated source material emanating from the outlets of the distribution pipe. In particular, a circumferential edge of each aperture 32 may be configured to block an outer portion of the plume of evaporated source material emanating from an associated outlet. As the outer angular portions of the plumes of evaporated source material may be blocked by the shielding device, the evaporated source material does not impact on the substrate at a large angle of incidence. Shadowing effects due to the mask can be reduced, and accurate edges of the deposited pixels can be achieved.

The evaporated source material which is blocked by the shielding device may attach to the shielding device and condensate thereon. Attached source material may build up on the shielding device. In particular, a layer of source material may form on the surface of the shielding device during deposition, as is indicated by reference numeral 35 in FIG. 3. In particular, a layer of source material may form on the inner surface of the apertures and/or on the shielding wall surrounding the apertures such that the diameter of the apertures may become smaller with increasing duration of deposition. For example, in some embodiments described herein, the apertures of the shielding device may have a small diameter of 7 mm or less, particularly 5 mm or less. A small diameter of the apertures of the shielding device may improve the deposition accuracy. However, a small aperture diameter tends to clog more easily, which deteriorates the deposition efficiency and deposition uniformity.

Embodiments of operating a deposition apparatus described herein are provided for maintaining a high deposition accuracy over a long time period, while at the same time clogging of the apertures can be prevented.

A method of operating a deposition apparatus 100 according to embodiments herein is described with reference to FIG. 4A and FIG. 4B. The deposition apparatus may have some or all of the features of the previously described deposition apparatus. Details of the deposition apparatus 100 are not repeated here, in order to avoid repetition.

Figure 4A:
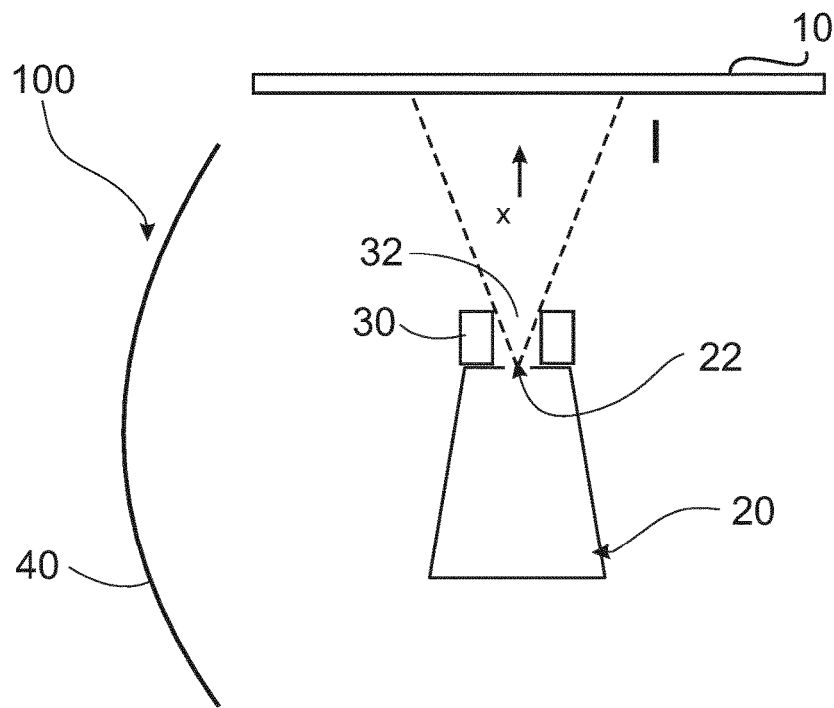
FIG. 4A and FIG. 4B show two subsequent phases of a method of operating a deposition apparatus according to embodiments described herein.

The method described herein includes depositing an evaporated source material on a substrate 10, as is illustrated in FIG. 4A. Deposition of the evaporated source material includes guiding the evaporated source material toward the substrate 10 in a main emission direction X, wherein part of the evaporated source material is blocked by a shielding device 30 arranged between the plurality of outlets 22 and the substrate 10 for shaping the plume of evaporated source material.

During deposition, the shielding device 30 may be kept at a first temperature, which may be a low temperature, e.g. a temperature below 150° C., particularly a temperature of 100° C. or less, or 50° C. or less. For example, the surface of the shielding device which faces toward the substrate may be kept at a temperature of 100° C. or less during deposition, in order to reduce a radiation of heat toward the mask and/or toward the substrate. In some embodiments, the shielding device 30 may be actively or passively cooled during deposition, e.g. via cooling channels or via a thermoelectric cooling device attached to the shielding device.

As the surface of the shielding device 30 may be kept at a low temperature, the evaporated source material which is blocked by the shielding device may condensate on the shielding device and attach thereto. Therein, part of the blocked source material may attach to the shielding device such as to form an attached source material on the shielding device. The aperture diameter may be become smaller, and there may be a risk of clogging.

Figure 4B:
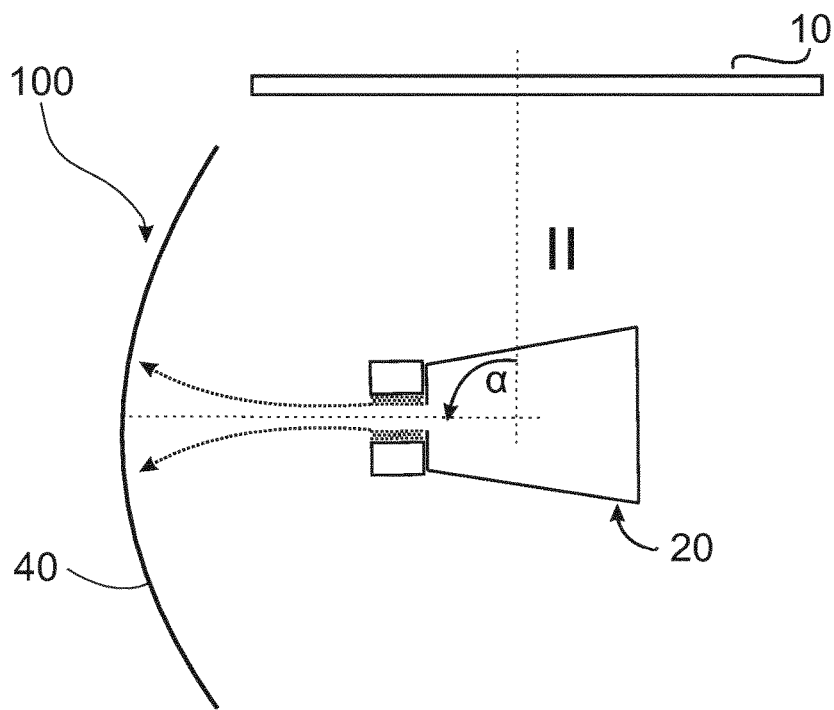

According to methods described herein, the deposition phase illustrated in FIG. 4A is followed by a cleaning phase illustrated in FIG. 4B, wherein at least part of the source material accumulated on the shielding device 30 is removed from the shielding device by heating the shielding device to a second temperature, which is above the first temperature. The shielding device may be heated at least locally, particularly at surface sections of the shielding device with accumulated source material. For example, the shielding wall sections surrounding the apertures 32 of the shielding device may be heated, because some of the evaporated source material is typically blocked by the shielding wall sections surrounding the apertures.

In some embodiments, the shielding device may be at least locally heated to a temperature above an evaporation temperature of the source material during cleaning, e.g. to a temperature above 100°, or above 200°, particularly to a temperature of 300° C. or more. The attached source material can be released from the shielding device and re-evaporate. Accordingly, the shielding device can be cleaned.

In some embodiments, the shielding device 30 faces toward the substrate 10 during deposition, whereas the shielding device 30 does not face toward the substrate 10 during heating. Accordingly, deposition of the re-evaporated source material from the shielding device on the substrate can be avoided. Further, thermal expansion of the mask and/or of the substrate due to heat radiation from the heated shielding device can be avoided.

In some embodiments, which may be combined with other embodiments described herein, the emission of evaporated source material through the outlets 22 of the evaporation source 20 can be stopped during cleaning. For example, the outlets 22 may be closed or evaporation may be stopped during the cleaning phase. The consumption of source material can be reduced.

In some embodiments, which can be combined with other embodiments described herein, the deposition apparatus may be set into a service position II for cleaning. In particular, after deposition, the deposition apparatus may be brought from a deposition position I, in which the apertures of the shielding device are directed toward the substrate 10, into the service position II, in which the apertures of the shielding device are not directed toward the substrate.

A "deposition position" as used herein may be a state of the deposition apparatus in which the deposition apparatus is ready for guiding evaporated source material toward a substrate. For example, the outlets of the evaporation source and the apertures of the shielding device may face toward the substrate or toward the deposition area of the deposition apparatus.

A "service position" as used herein may be a state of the deposition apparatus which is not suitable for guiding evaporated source material toward the substrate. For example, the outlets of the evaporation source and the apertures of the shielding device may not face toward the substrate or toward the deposition area of the deposition apparatus. Setting the deposition apparatus from the deposition position into the service position may include a movement of the evaporation source, e.g. a rotational movement. In some embodiments, setting the deposition apparatus into the service position may include moving the evaporation source into a position, in which a heating device 50 is provided to heat the shielding device and/or in which the shielding device faces toward a material collection unit such as a shielding wall.

In some embodiments, setting the deposition apparatus into the service position II may include a relative movement between the evaporation source 20 and the material collection unit 40. For example, in the embodiment shown in FIG. 4A and FIG. 4B, the evaporation source 20 is moved from the deposition position I shown in FIG. 4A to the service position II shown in FIG. 4B, wherein the shielding device 30 is directed toward the material collection unit 40 in the service position II.

Moving the evaporation source to the service position II may include rotating the evaporation source 20 by a rotation angle, particularly by a rotation angle α of 20° or more, more particularly by a rotation angle from 60° to 120°. In the embodiment shown in FIG. 4B, the evaporation source is rotated by a rotation angle of approximately 90° from the deposition position I to the service position II.

The shielding device 30 may be heated in the service position II, in which the shielding device 30 faces toward the material collection unit 40. The material collection unit 40 may be provided as a wall element, e.g. a condensation wall or a shielding wall. As is indicated in FIG. 4B, the wall element may by curved. A distance between the wall element and the shielding device can be kept essentially constant during the rotation movement of the evaporation source. Further, due to the curved shape of the wall element, the wall element may act as a shield that blocks evaporated source material emitted from the evaporation source 20 essentially during the entire rotational movement of the evaporation source 20. For example, the wall element may extend over an angle of 45° or more, particularly 90° or more, with respect to the rotation axis of the evaporation source.

In some embodiments, cleaning may comprise heating the shielding device for a time period of 1 second or more, particularly 10 seconds or more. A longer heating period may lead to a better cleaning result but may slow down the evaporation process. Good cleaning results can be achieved by heating over a time period between 1 second and 60 seconds.

After cleaning, deposition of the evaporated source material on the substrate or on a further substrate may continue. Before continuing with the deposition, in some embodiments, the evaporation source may be brought from the service position II back to the deposition position I or to a further deposition position. For example, the evaporation source may be rotated by the angle (−α) back to the deposition position I, or alternatively, the evaporation may be brought to a further deposition position by further rotating the evaporation source in the same rotation direction, e.g. by another angle α.

In some embodiments, which may be combined with other embodiments described herein, deposition and cleaning may be alternately performed. For example, the shielding device may be cleaned after a predetermined deposition period, respectively, and, after cleaning, deposition may continue, respectively. In some embodiments, cleaning of the shielding device may be performed after deposition of evaporated material on every substrate, or after having coating a predetermined number of substrates, e.g. after having coated 2 substrates, 4 substrates or more substrates. In some embodiments, cleaning of the shielding device may be performed after several minutes, hours or days of deposition operation, respectively. The time period, after which cleaning is performed, may depend on the size and shape of the apertures of the shielding device, on the distance between the outlets of the evaporation source and the shielding device, as well as on the temperature of the surface of the shielding device during deposition. For example, cleaning may be performed after deposition of evaporated material on each substrate or after a deposition period of up to several hours, respectively.

In some embodiments, the accumulation of source material on the shielding device may be measured, and cleaning may be performed after accumulation of a predetermined amount of attached source material on the shielding device. Clogging of the apertures of the shielding device can be prevented and a constant plume of evaporated source material impacting on the substrate can be obtained.

In order to avoid a substantial heat load on the substrate by the heated shielding device, the shielding device may be allowed to cool down after the cleaning. For example, the shielding device may be cooled down to the first temperature, e.g. a temperature of 150° C. or less, or 100° or less, after cleaning and before continuing deposition. In some embodiments, a heating device 50 which is configured for heating the shielding device during cleaning is switched off for a predetermined period before continuing deposition. In some embodiments, the shielding device is passively or actively cooled after the cleaning and/or before continuing deposition. Further, the shielding device may additionally or alternatively be passively or actively cooled during deposition. Passive cooling may comprise cooling via a cooling fluid. Active cooling may comprise cooling via an active cooling element, e.g. a thermoelectric cooling element, a Peltier element or a piezoelectric cooling element.

As is illustrated in FIGS. 4A and 4B, the shielding device 30 may include one or more apertures 32 through which the evaporated source material may pass. During deposition, the apertures 32 may face toward the substrate 10 (FIG. 4A), and during cleaning, the apertures may face toward the material collection unit 40 (FIG. 4B).

The shielding device may be configured to block evaporated source material having an emission angle greater than 45° with respect to the main emission direction X of the evaporated source material from the plurality of outlets 22.

As is shown in FIG. 4A and FIG. 4B, bringing the deposition apparatus 100 from the deposition position I to the service position II may include moving the evaporation source 20, e.g. rotation of the evaporation source 20.

Figure 5A:
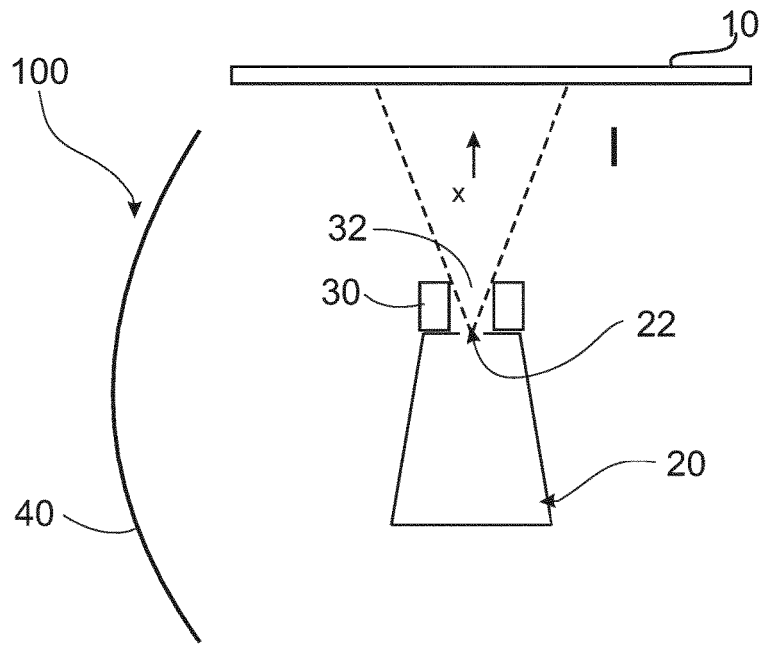
FIG. 5A and FIG. 5B show two subsequent phases of a method of operating a deposition apparatus according to embodiments described herein.
Figure 5B:
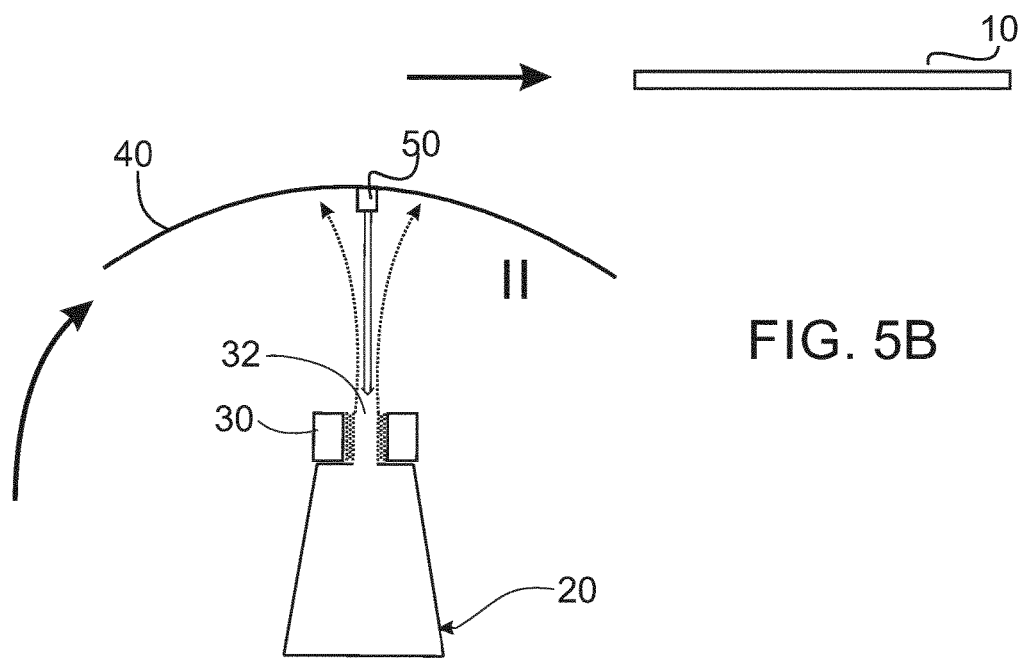

Alternatively, as is shown in FIG. 5A and FIG. 5B, bringing the deposition apparatus from the deposition position I to the service position II may include moving a material collection unit 40, e.g. a condensation wall or shielding wall, with respect to the evaporation source. In the service position II, the material collection unit 40 may be arranged in front of the apertures 32 of the shielding device 30.

For example, the material collection unit 40 can be moved into a space between the evaporation source and a substrate holding area such that the main emission direction X of the evaporation source intersects the material collection unit 40. The material collection unit 40 may be a curved wall segment, in order to make sure that most of the source material re-evaporated from the shielding device hits the wall segment.

In some embodiments, which may be combined with other embodiments described herein, cleaning may include directing electromagnetic radiation onto the accumulated source material for releasing the source material from the shielding device 30. For example, at least one of microwave radiation, thermal radiation, laser radiation, IR radiation, and UV radiation may be directed to the shielding device, particularly onto sections of the shielding device which are covered by source material.

In the embodiment shown in FIG. 5B, the deposition apparatus 100 includes a heating device 50 including a source of electromagnetic radiation. The source of electromagnetic radiation may include one or more light sources such as a lamp, e.g. a halogen heat lamp, a UV lamp, an IR light source, a laser, a flash lamp, or an LED. In some embodiments, the source of electromagnetic radiation may be or comprise a microwave generator or a heat radiator.

In some embodiments, one or more halogen heat lamps, e.g. tungsten-halogen heat lamps may be provided for heating the shielding device. The heat lamp may be a broadband emission lamp with an emission range reaching from UV radiation to NIR radiation.

In some embodiments, a plurality of lamps may be provided, which may be directed to different sections of the shielding device, e.g. to the edges of different apertures. For example, 10 or more lamps or 100 or more lamps may be provided.

In some embodiments, one or more laser sources may be used for at least locally heating the shielding device in the service position. In particular, the condensed source material may be laser evaporated. For example, one or more VCSELs (vertical-cavity surface-emitting lasers) may be provided.

In some embodiments, one or more microwave sources may be used for re-evaporating the source material from the shielding device. Microwave sources may be cheap as compared to some of the light sources mentioned above. Microwave sources may further provide a good radiation uniformity.

In some embodiments, the shielding device may be heated via one or more UV lamps. Organic materials may absorb UV light, particularly in the wavelength range between 350 nm and 400 nm, wherein the absorption of UV light may lead to heating and re-evaporation of the organic materials. The heating load on the shielding device may be smaller as compared to other heating devices. UV light may lead to a decomposition of some organic molecules.

The heating device may be arranged such that electromagnetic radiation can be directed to surface sections of the shielding device when the deposition apparatus is in the service position II. For example, the heating device may be attached to or placed in the material collection unit 40. In some embodiments, the heating device may be arranged at a center of the material collection unit.

Heating with a source of electromagnetic radiation provides the advantage that the accumulated source material is heated from the top such that the source material may easily re-evaporate, and the temperature of the shielding device may be kept comparatively low ("top-down-heating"). Accordingly, the shielding device can be cooled down more quickly after the cleaning and before continuing deposition.

The remaining features of the embodiment shown in FIG. 5A and FIG. 5B may essentially correspond to the features of the embodiment shown in FIG. 4A and FIG. 4B so that reference can be made to the above explanations which are not repeated here.

Figure 6A:
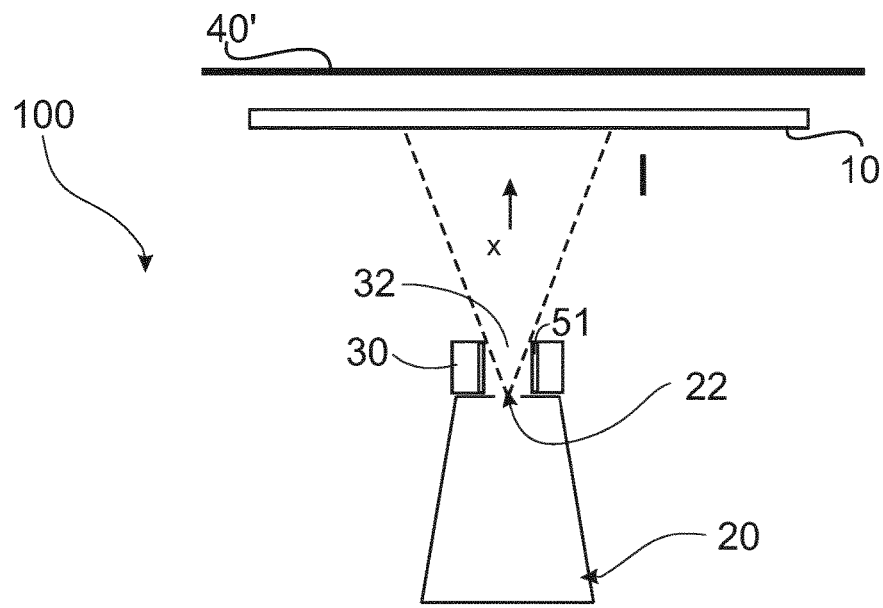
FIG. 6A and FIG. 6B show two subsequent phases of a method of operating a deposition apparatus according to embodiments described herein.
Figure 6B:
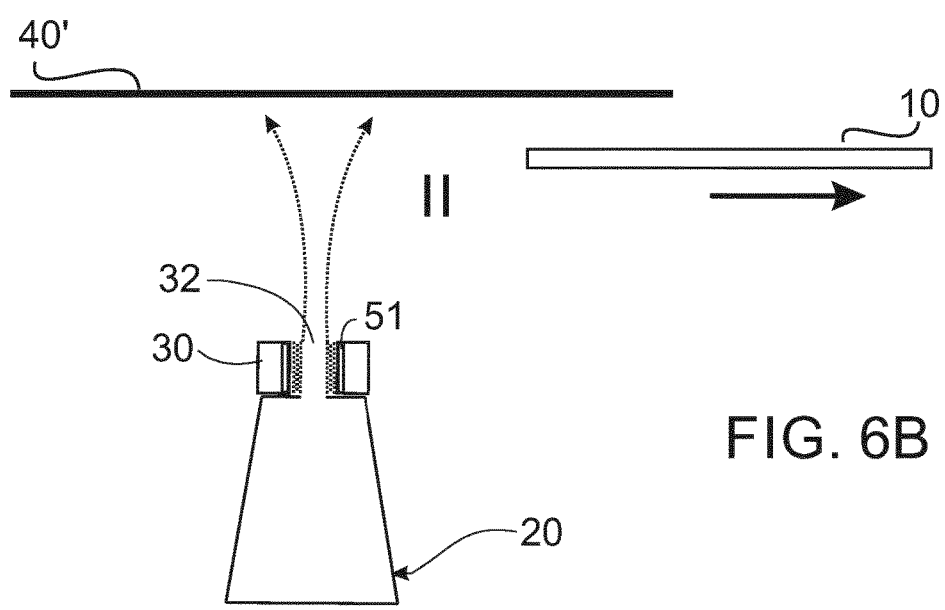

FIG. 6A and FIG. 6B show a further deposition apparatus according to some embodiments described herein which may be operated in accordance with the methods described herein.

As is shown in FIG. 6A and FIG. 6B, bringing the deposition apparatus 100 from the deposition position I to the service position II may include moving the substrate 10 out of a deposition area in front of the evaporation source. A material collection unit, e.g. a wall element 40' may be arranged behind the substrate 10 during deposition, as is shown in FIG. 6A. After deposition, the substrate may be moved away, whereupon the outlets 22 and the shielding device 30 may be directed toward the wall element 40'.

Source material attached to the shielding device 30 may be re-evaporated by heating the shielding device, whereupon the re-evaporated source material may propagate toward and attach to the wall element 40'. In some embodiments, the material collection unit may be provided as an essentially flat wall element.

In some embodiments, which may be combined with other embodiments described herein, cleaning may comprise thermoelectrically or inductively heating one or more surface sections of the shielding device 30 for releasing the attached source material from the heated surface sections.

In the embodiment shown in FIG. 6A and FIG. 6B, a heating element 51, e.g. a thermoelectric heater, is integrated in the shielding device 30. In some embodiments, which may be combined with other embodiments described herein, one or more heating elements may be attached to the shielding device 30. Alternatively, the shielding device may be at least partially configured as the heating element. For example, the shielding device 30 may be at least partially coated with a heating material such that the surface of the shielding device comprises one or more heater areas that can be heated up to temperatures above the evaporation temperature of the source material, e.g. above 100° C. or above 200° C., particularly to 300° C. or more. In some embodiments, which can be combined with other embodiments described herein, shielding wall portions surrounding the apertures of the shielding device may be coated with a heater material, e.g. via physical vapor deposition such as sputtering, or can be at least partially made of a heater material.

For example, non-heating areas of the shielding device may be covered with a protective material, e.g. with a tape, whereupon the shielding device may be coated with a heater material. The protective material can be removed after coating, and electrical contacts may be connected to the heater material. As a result, the shielding device can be thermoelectrically heated in surface sections which tend to get covered with source material during deposition. For example, the surface sections surrounding the apertures of the shielding device may be configured as a surface that can be heated.

At least a section of a surface of the shielding device may be configured as a heating surface that can be thermoelectrically or inductively heated.

Figure 7A:
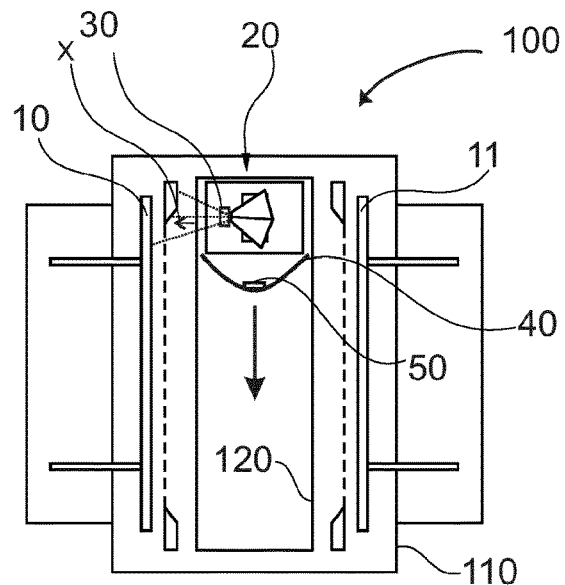
FIG. 7A, FIG. 7B, and FIG. 7C show three subsequent phases of a method of operating a deposition apparatus according to embodiments described herein.
Figure 7B:
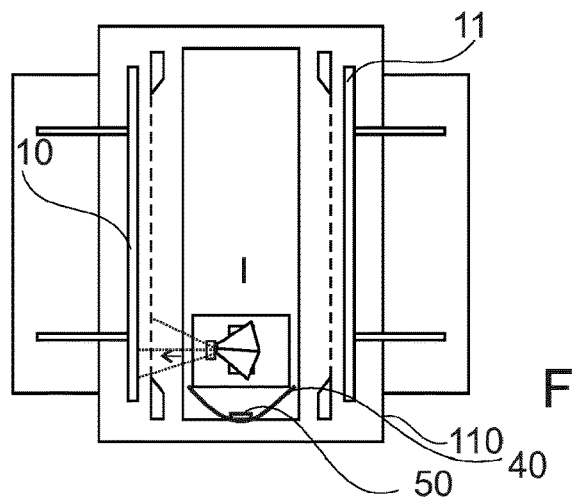
Figure 7C:
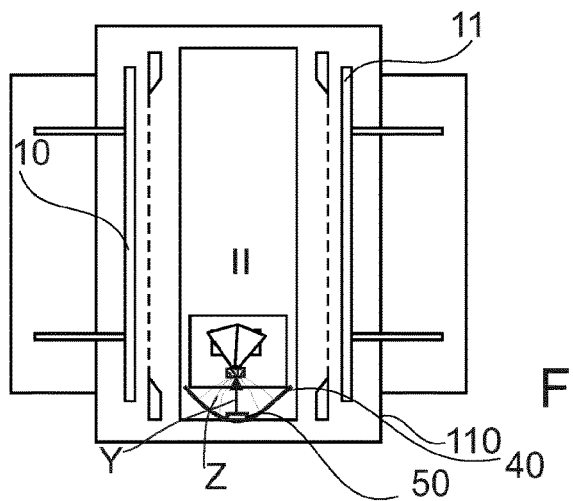

FIG. 7A, FIG. 7B, and FIG. 7C show three subsequent phases of a method for operating a deposition apparatus 100 according to embodiments described herein. The deposition apparatus 100 may essentially correspond to the deposition apparatus shown in FIG. 1 so that reference can be made to the above explanations which are not repeated here. The deposition apparatus 100 may further include some or all of the features described with reference to FIGS. 2A to 6B.

The deposition apparatus shown in FIG. 7A includes an evaporation source 20 which is configured to deposit an evaporated source material on a substrate 10. The evaporation source includes a distribution pipe with a plurality of outlets for guiding the evaporated source material toward the substrate along a main emission direction X. The plume of evaporated material is indicated in FIG. 7A. The evaporation source 20 further includes a shielding device 30 arranged downstream from the plurality of outlets 22, wherein the shielding device is configured to shape the plume of evaporated source material, particularly to block an outer angular range of the emission cone.

The shielding device 30 may include a plurality of apertures, wherein each aperture may be configured to shape a plume of evaporated source material emanating from an associated outlet, particularly wherein a circumferential edge of each aperture 32 is configured to block an outer portion of the plume of evaporated source material emanating from the associated outlet in order to reduce the shadowing effect of the mask. Blocking the evaporated source material may lead to an accumulation of source material on the shielding device, particularly on the edges surrounding the apertures, respectively.

As is illustrated in FIG. 7A, the evaporation source 20 may be moved along a surface of the substrate 10 in a width direction of the substrate, while the evaporated source material may be guided toward the substrate 10 through a mask. A linear guide 120 may be provided for linearly moving the evaporation source along the substrate surface.

In FIG. 7B, the evaporation source 20 has reached the opposite end of the substrate so that the full width of the substrate can be coated.

After a predetermined period of deposition processing, a cleaning period may follow. Deposition may be stopped. For example, the coated substrate 10 may be removed from the vacuum chamber 110. For cleaning the shielding device 30, the deposition apparatus 100 may be brought into a service position II that is illustrated in FIG. 7C. In particular, the evaporation source may be rotated by a rotation angle, e.g. by about 90°, around a rotation axis.

In some embodiments, an actuator device may be provided to bring the deposition apparatus from the deposition position I shown in FIG. 7B to the service position II shown in FIG. 7C. The actuator may include a motor such as an electric motor configured to move the evaporation source, e.g. to rotate the evaporation source.

The deposition apparatus 100 may further include a material collection unit 40, e.g. a shielding wall, wherein the shielding device 30 faces toward the material collection unit 40 when the evaporation source is in the service position II.

In the service position II, the shielding device 30 may be cleaned by at least locally heating the shielding device 30, e.g. via a heating device 50. The heating device 50 may include a source of electromagnetic radiation, e.g. a lamp. Heating may include at least locally heating the shielding device to a temperature above the evaporation temperature of the source material so that the accumulated source material may re-evaporate and propagate toward the material collection unit 40 where the re-evaporated source material may condensate. The shielding device may be cleaned.

Afterward, in some embodiments, the shielding device may be active or passively cooled to a temperature below the evaporation temperature of the source material, e.g. to a temperature below 100° C. such as 50° C. or less. Deposition may continue.

In some embodiments, after cleaning, the evaporation source may be rotated by a second rotation angle to a further deposition position in which the shielding device may face toward a further substrate 11. In the embodiments shown in FIG. 7C, the evaporation source may be rotated counter-clockwise by another 90° such that the shielding device 30 is directed to the right side in FIG. 7C.

In a further phase (not shown), the further substrate 11 may be coated, while the evaporation source 20 is linearly moved along the surface of the further substrate, i.e. upward in FIG. 7C.

Further cleaning phases may follow after predetermined periods of deposition operation, respectively. A good uniformity of the deposited pixels as well as accurate pixel shapes can be obtained, and the shadowing effect due to the masks can be reduced.

Figure 8:
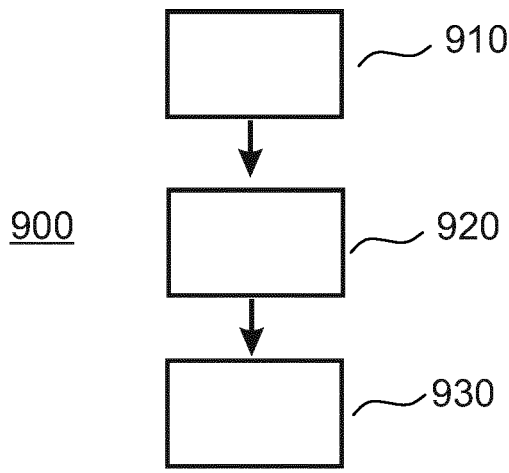
FIG. 8 is a flow diagram illustrating a method of operating a deposition apparatus according to embodiments herein.

FIG. 8 is a flow diagram illustrating a method 900 of operating a deposition apparatus according to embodiments herein. In box 910, an evaporated source material is deposited on a substrate by guiding the evaporated source material from a plurality of outlets 22 of an evaporation source 20 toward the substrate 10, wherein part of the evaporated source material is blocked by a shielding device 30 arranged between the plurality of outlets 22 and the substrate. In box 920, the shielding device is cleaned by at least locally heating the shielding device 30. Before cleaning, the evaporation source may be moved to a service position, e.g. by rotating the evaporation source by a rotation angle. In optional box 930, deposition of evaporated source material on the substrate or on a further substrate may continue. Before continuing with the deposition, the evaporation source may be moved from the service position to a deposition position and/or cooled.

The surface temperature of the shielding device during deposition may be kept lower than the surface temperature of the shielding device during cleaning. In particular, the surface temperature of the shielding device during cleaning may be higher than the evaporation temperature of the source material, and/or the surface temperature of the shielding device during deposition may be lower than the evaporation temperature of the source material.

Figure 9:
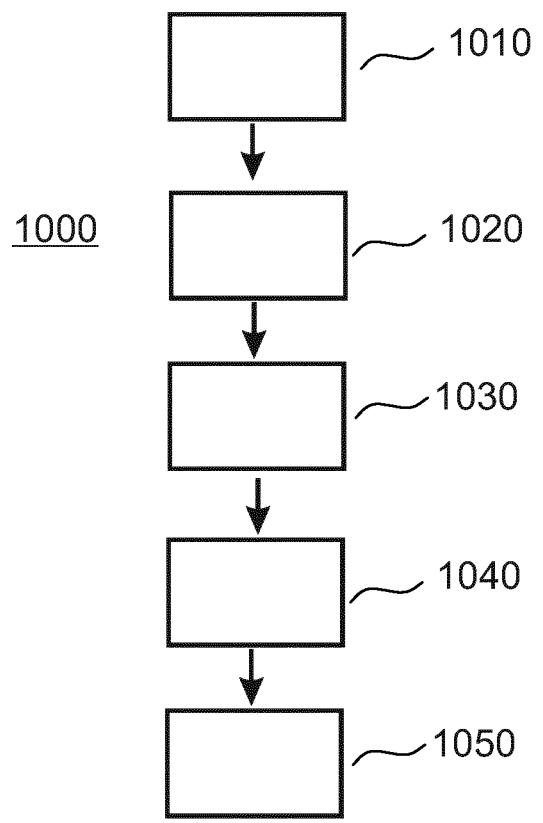
FIG. 9 is a flow diagram illustrating a method of operating a deposition apparatus according to embodiments described herein.

FIG. 9 is a flow diagram illustrating a method 1000 of operating a deposition apparatus according to embodiments herein. In box 1010, an evaporated source material is deposited on a substrate 10. An evaporation source 20 is linearly moved along a surface of the substrate 10, while the evaporated source material is guided from a plurality of outlets 22 of the evaporation source 20 toward the substrate, wherein part of the evaporated source material is blocked by a shielding device 30 that may be maintained at a first temperature during deposition. In box 1020, the evaporation source is rotated by a first rotation angle α from a deposition position I to a service position II. In box 1030, the shielding device 30 is cleaned by at least locally heating the shielding device 30 in the service position II to a second temperature higher than the first temperature.

In box 1040, the evaporation source 20 is rotated by a second rotation angle back to the deposition position I or to a further deposition position. In box 1050, the evaporated source material is deposited on a further substrate 11. The evaporation source is linearly moved along a surface of the substrate or of a further substrate, while the evaporated source material is guided from the plurality of outlets 22 toward the further substrate. The linear movement of the evaporation source 20 in box 1050 may be opposite to the linear movement of the evaporation source in box 1010. During deposition, the temperature of the shielding device may be kept at the first temperature, i.e. at the lower temperature.

This written description uses examples to disclose the disclosure, including the best mode, and also to enable any person skilled in the art to practice the described subject-matter, including making and using any devices or systems and performing any incorporated methods. While various specific embodiments have been disclosed in the foregoing, mutually non-exclusive features of the embodiments described above may be combined with each other. The patentable scope is defined by the claims, and other examples are intended to be within the scope of the claims if they have structural elements that do not differ from the literal language of the claims, or if they include equivalent structural elements with insubstantial differences from the literal language of the claims.

The invention claimed is:

1. A method of depositing an evaporated source material on a substrate, comprising:
   guiding the evaporated source material from one or more outlets of an evaporation source toward a substrate through a shielding device arranged between the one or more outlets and the substrate;
   cleaning the shielding device by moving the evaporation source relative to a material collection unit from a deposition position (I) to a service position (II), in which the shielding device faces toward the material collection unit; and
   at least locally heating the shielding device in the service position (II).

2. The method of claim 1, wherein the moving the evaporation source to the service position (II) comprises moving the evaporation source such that the direction of the outlets is moved by an angle (α) of at least 20°.

3. The method of claim 1, wherein the moving the evaporation source to the service position (II) comprises moving the evaporation source such that the direction of the outlets is moved by an angle from 60° to 120°.

4. The method of claim 1, further comprising:
   moving the evaporation source from the service position (II) back to the deposition position (I) after the cleaning; and
   continuing deposition of the evaporated source material on a substrate.

5. The method of claim 1, wherein deposition and cleaning are performed alternately and the shielding device is cleaned after a predetermined time period of deposition.

6. The method of claim 1, wherein the shielding device is cooled after it is cleaned.

7. The method of claim 1, wherein the heating comprises thermoelectrically or inductively heating of one or more surface sections of the shielding device.

8. The method of claim 1, wherein the heating comprises directing electromagnetic radiation selected from the group of microwave radiation, thermal radiation, laser radiation and UV radiation, onto the source material disposed on the shielding device.

9. The method of claim 1, wherein the shielding device blocks evaporated source material having an emission angle greater than 45° with respect to a main emission direction (X) of the evaporated source material from the one or more outlets.

10. A method of depositing an evaporated source material on a substrate, comprising:
    moving an evaporation source along a surface of a substrate;
    guiding the evaporated source material from one or more outlets of the evaporation source toward the substrate, wherein part of the evaporated source material is blocked by, and attaches to, a shielding device arranged between the one or more outlets and the substrate;
    moving the evaporation source such that the direction of the outlets is moved by a first movement angle from a deposition position (I) to a service position (II);
    cleaning the shielding device by at least locally heating the shielding device in the service position (II);
    moving the evaporation source such that the direction of the outlets is moved by a second movement angle back to the deposition position (I) or to a further deposition position;
    moving the evaporation source along a surface of the substrate or a further substrate; and
    guiding the evaporated source material from the one or more outlets toward a substrate.

11. The method of claim 10, wherein moving the evaporation source such that the direction of the outlets is moved by the first movement angle corresponds to: rotating the evaporation source by a first rotation angle from the deposition position (I) to the service position (II), and wherein moving the evaporation source such that the direction of the outlets is moved by the second movement angle corresponds to: rotating the evaporation source by a second rotation angle back to the deposition position (I) or to the further deposition position.

12. A deposition apparatus, comprising:
an evaporation source configured to deposit an evaporated source material on a substrate, comprising:
  a distribution pipe with one or more outlets for guiding the evaporated source material toward the substrate; and
  a shielding device arranged downstream from the one or more outlets and configured to partially block evaporated source material propagating toward the substrate;
an actuator device configured to bring the deposition apparatus from a deposition position (I) to a service position (II); and
a heating device for at least locally heating the shielding device when the deposition apparatus is in the service position (II).

13. The deposition apparatus of claim 12, wherein the shielding device comprises a plurality of apertures configured to shape a plume of evaporated source material emanating from an associated outlet.

14. The deposition apparatus of claim 13, wherein a circumferential edge of each aperture is configured to block an outer portion of the plume of evaporated source material emanating from the associated outlet.

15. The deposition apparatus of claim 12, wherein the heating device is placed in, or integrated into, the shielding device.

16. The deposition apparatus of claim 12, wherein the heating device is a thermoelectric device or an inductive device.

17. The deposition apparatus of claim 12, further comprising a material collection unit, wherein the shielding device faces toward the material collection unit when the evaporation source is in the service position (II).

18. The deposition apparatus of claim 12, wherein the heating device comprises a source of electromagnetic radiation configured to direct electromagnetic radiation toward the shielding device in the service position (II).

19. The deposition apparatus of claim 12, wherein the heating device is selected from the group of a light source, a laser, an LED, a UV lamp, an IR light source, a halogen heat lamp, and a microwave generator.

20. The deposition apparatus of claim 12, wherein the source of electromagnetic radiation is placed at, or integrated into, the material collection unit.

* * * * *